United States Patent
Funakoshi et al.

(10) Patent No.: US 8,890,051 B2
(45) Date of Patent: Nov. 18, 2014

(54) INTEGRATING CIRCUIT AND LIGHT-DETECTION DEVICE

(75) Inventors: Haruhiro Funakoshi, Hamamatsu (JP); Shinya Ito, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 196 days.

(21) Appl. No.: 13/379,103

(22) PCT Filed: Jun. 10, 2010

(86) PCT No.: PCT/JP2010/059826
§ 371 (c)(1),
(2), (4) Date: Feb. 9, 2012

(87) PCT Pub. No.: WO2010/150657
PCT Pub. Date: Dec. 29, 2010

(65) Prior Publication Data
US 2012/0127460 A1 May 24, 2012

(30) Foreign Application Priority Data
Jun. 22, 2009 (JP) ................. 2009-147637

(51) Int. Cl.
| H01J 40/14 | (2006.01) |
| G01J 1/46 | (2006.01) |
| H03F 3/00 | (2006.01) |
| H03F 3/45 | (2006.01) |
| H03F 3/08 | (2006.01) |

(52) U.S. Cl.
CPC . *G01J 1/46* (2013.01); *H03F 3/005* (2013.01); *H03F 3/45* (2013.01); *H03F 3/08* (2013.01)
USPC ............ 250/214 A; 250/214 LA; 250/214 R; 250/214 LS; 330/252; 330/110; 330/308

(58) Field of Classification Search
CPC ............ H03F 3/005; H03F 3/08; H03F 3/45; H03F 3/45475; G01J 1/44; G01J 1/46
USPC ............ 250/214 R, 214 A, 214 LA, 214 LS, 250/214 AG, 214 C; 330/252, 260, 261, 59, 330/110, 308; 327/345, 363, 514
See application file for complete search history.

(56) References Cited

U.S. PATENT DOCUMENTS

| 4,786,831 A * | 11/1988 | Morse et al. .............. 327/566 |
| 2002/0190193 A1 | 12/2002 | Mizuno et al. |
| 2005/0199813 A1* | 9/2005 | Van Bogget ............... 250/338.1 |
| 2013/0038393 A1* | 2/2013 | Funakoshi et al. ......... 330/253 |

FOREIGN PATENT DOCUMENTS

| CN | 1708983 | 12/2005 |
| JP | 6-105067 | 4/1994 |
| JP | 2005-244506 | 9/2005 |
| JP | 2006-505975 | 2/2006 |
| TW | 200837714 | 9/2008 |
| WO | WO 2007/125728 | 11/2007 |

* cited by examiner

*Primary Examiner* — Kevin Pyo
(74) *Attorney, Agent, or Firm* — Drinker Biddle & Reath LLP

(57) ABSTRACT

A photodetecting device 1 includes a photodiode PD and an integrating circuit 10. The integrating circuit 10 includes an amplifier circuit 20, a capacitive element C, a first switch $SW_1$, and a second switch $SW_2$. The second switch $SW_2$ is provided between a reference potential input terminal to which a reference potential Vref is input and a terminal of the capacitive element C on the inverting input terminal side of the amplifier circuit 20, and the second switch is opened or closed according to the level of a second reset signal Reset2, and is capable of applying the reference potential Vref to the terminal of the capacitive element. Thus, an integrating circuit and a photodetecting device capable of achieving both low power consumption and high speed can be realized.

2 Claims, 3 Drawing Sheets

INTEGRATING CIRCUIT AND LIGHT-DETECTION DEVICE

TECHNICAL FIELD

The present invention relates to an integrating circuit which accumulates an input electric charge and outputs a voltage value according to the amount of accumulated electric charge, and to a photodetecting device including the integrating circuit and a photodiode.

BACKGROUND ART

As the photodetecting device, the one including a photodiode and an integrating circuit is known (for example, see Patent Document 1). This integrating circuit includes an amplifier circuit having a first input terminal, a second input terminal, and an output terminal; and a capacitive element and a switch provided between the first input terminal and the output terminal of the amplifier circuit, the capacitive element and the switch being connected in parallel to each other. In this photodetecting device, the switch of the integrating circuit is closed so that the capacitive element in the integrating circuit is discharged, and the voltage value output from the integrating circuit is initialized. When the switch of the integrating circuit is opened, an electric charge generated in the photodiode is accumulated in the capacitive element of the integrating circuit, and a voltage value according to the amount of accumulated electric charge is output from the integrating circuit. Further, if the photodetecting device includes a plurality of photodiodes arranged in one dimension or in two dimensions, it is possible to obtain an optical image in one dimension or in two dimensions.

CITATION LIST

Patent Literature

Patent Document 1: Japanese Patent Application Laid-Open No. H06-105067

SUMMARY OF INVENTION

Technical Problem

In the photodetecting device, there is a need to increase the number of photodiodes arranged, and accordingly, there is also a need to achieve high speed and low power consumption. However, an attempt to reduce the power consumption of the integrating circuit included in the photodetecting device results in a lowering of the drive capability of the amplifier circuit, so that the time required for the output voltage value of the integrating circuit to be initialized by closing the switch of the integrating circuit will increase. That is, conventionally, it is difficult to achieve both low power consumption and high speed.

The present invention has been made in order to solve the above-described problem, and has an object to provide an integrating circuit and a photodetecting device capable of achieving both low power consumption and high speed.

Solution to Problem

An integrating circuit according to the present invention includes (1) an amplifier circuit with a first input terminal, a second input terminal, and an output terminal, (2) a capacitive element provided between the first input terminal and the output terminal of the amplifier circuit, (3) a first switch provided in parallel to the capacitive element between the first input terminal and the output terminal of the amplifier circuit, and (4) a second switch provided between a reference potential input terminal to which a reference potential is input and a terminal of the capacitive element on the first input terminal side of the amplifier circuit, the second switch applying the reference potential to the terminal of the capacitive element. Note that, of the first input terminal and the second input terminal of the amplifier circuit, one is an inverting input terminal and the other is a non-inverting input terminal.

A photodetecting device according to the present invention includes (1) the integrating circuit according to the above-described invention, and (2) a photodiode which generates an amount of electric charge according to an amount of incident light and causes the generated electric charge to enter the first input terminal of the amplifier circuit in the integrating circuit.

In the present invention, when the first switch is closed in the integrating circuit to discharge the capacitive element and initialize the output voltage value of the integrating circuit, the second switch is also closed to apply the reference potential to the terminal of the capacitive element. Thus, the capacitive element of the integrating circuit is quickly discharged.

Advantageous Effects of Invention

According to the present invention, it is possible to achieve both low power consumption and high speed.

DESCRIPTION OF EMBODIMENTS

Hereinafter, with reference to the accompanying drawings, an embodiment of the present invention will be described in detail. In the description of the drawings, the same components are denoted by the same reference symbols, and overlapping description will be omitted.

Figure 1:
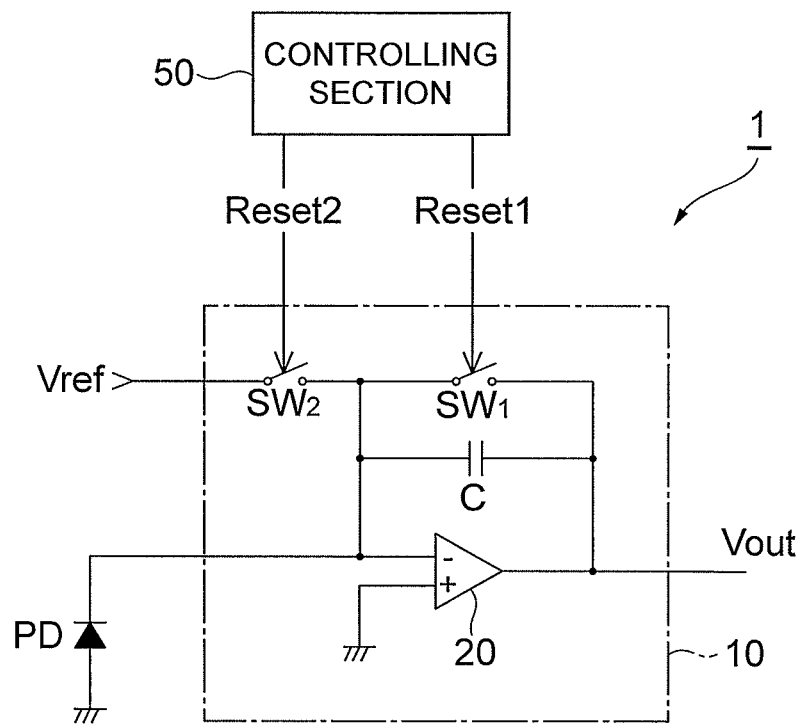
FIG. 1 is a view showing a configuration of a photodetecting device 1 according to an embodiment.

FIG. 1 is a view showing a configuration of a photodetecting device 1 according to an embodiment. The photodetecting device 1 shown in this figure includes a photodiode PD and an integrating circuit 10. The integrating circuit 10 includes an amplifier circuit 20, a capacitive element C, a first switch $SW_1$, and a second switch $SW_2$.

The amplifier circuit 20 has an inverting input terminal, a non-inverting input terminal, and an output terminal. The capacitive element C is provided between the inverting input terminal and the output terminal of the amplifier circuit 20. The first switch $SW_1$ is provided in parallel to the capacitive element C between the inverting input terminal and the output terminal of the amplifier circuit 20, and is opened or closed according to the level of a first reset signal Reset1. The non-inverting input terminal of the amplifier circuit 20 is connected to a ground potential. The non-inverting input terminal of the amplifier circuit 20 is not necessarily connected to the ground potential, but may be connected to a potential of 0.1 V or the like, for example, as long as it is connected to a fixed potential.

The second switch $SW_2$ is provided between a reference potential input terminal to which a reference potential Vref is input and a terminal of the capacitive element C on the inverting input terminal side of the amplifier circuit 20, and the second switch is opened or closed according to the level of a second reset signal Reset2 and is capable of applying the reference potential Vref to the terminal of the capacitive element C. The reference potential Vref may be the ground potential.

Figure 2:
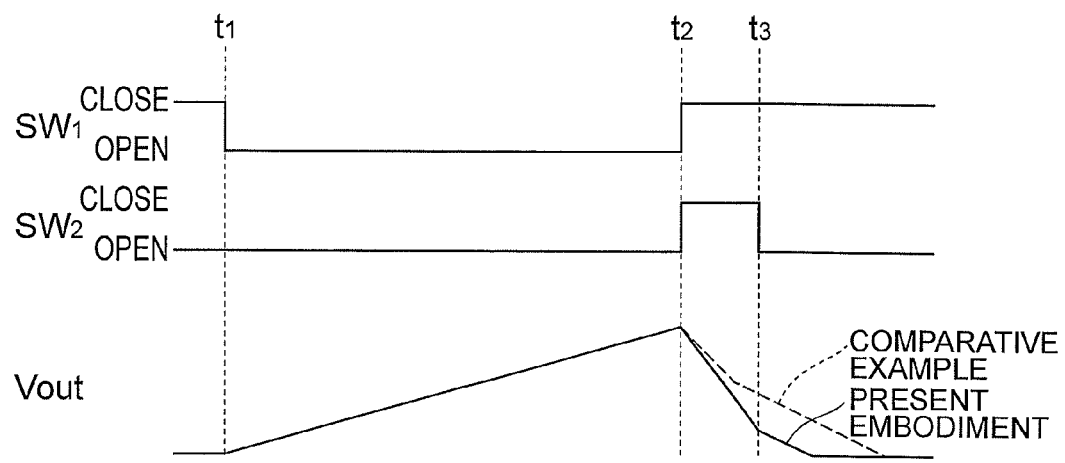
FIG. 2 is a view illustrating an operation of the photodetecting device 1 according to the embodiment.

The photodiode PD has a cathode terminal and an anode terminal, and generates an amount of electric charge according to an amount of incident light. The cathode terminal of the photodiode PD is connected to the inverting input terminal of the amplifier circuit 20. The anode terminal of the photodiode PD is connected to the ground potential, The photodetecting device 1 according to the present embodiment includes a controlling section 50 controlling the opening and closing of the first switch $SW_1$ and the second switch $SW_2$, respectively, and operates as follows under the control of this controlling section. FIG. 2 is a view illustrating an operation of the photodetecting device 1 according to the present embodiment. This figure shows, in order from the top, the open/close state of the first switch $SW_1$, the open/close state of the second switch $SW_2$, and an output voltage value Vout of the photodetecting device 1.

Before the time $t_1$, the first switch $SW_1$ is closed, the capacitive element C is discharged, and the output voltage value Vout of the photodetecting device 1 is set to an initial value. Moreover, before the time $t_1$, the second switch $SW_2$ is opened. At the time $t_1$, the first switch $SW_1$ switches from a close state to an open state.

During a period from the time $t_1$ to the time $t_2$, the first switch $SW_1$ and the second switch $SW_2$ are opened, respectively. During this period, the integrating circuit 10 inputs an electric charge generated in the photodiode PD to the inverting input terminal, accumulates the input electric charge into the capacitive element C, and outputs the voltage value Vout according to the accumulated amount of electric charge. Accordingly, the output voltage value Vout of the photodetecting device 1 gradually increases with time, At the time $t_2$, the first switch $SW_1$ and the second switch $SW_2$ switch from the open state to the close state, respectively. At the time $t_2$ and thereafter, the capacitive element C continues to be discharged, and the output voltage value Vout of the photodetecting device 1 will be set to the initial value. At the subsequent time $t_3$, the second switch $SW_2$ switches to the open state.

In FIG. 2, the output voltage value Vout of the photodetecting device 1 at the time $t_2$ and thereafter is indicated by a solid line for the present embodiment, while it is indicated by a dashed line for a comparative example. In the comparative example, the second switch $SW_2$ is not provided.

According to a simulation, in the comparative example in which the second switch $SW_2$ is not provided, the time required for the output voltage value Vout of the photodetecting device at the time $t_2$ and thereafter to reach the initial value is approximately 3.8 μs. In contrast, in the present embodiment in which the second switch $SW_2$ is provided, the time required for the output voltage value Vout of the photodetecting device 1 at the time $t_2$ and thereafter to reach the initial value is shorter than that in the case of the comparative example.

In this manner, in the present embodiment, at the time $t_2$, the first switch SW1 switches to the close state and the second switch $SW_2$ also switches to the close state, so that the time required for the output voltage value Vout to reach the initial value is shortened and high speed can be achieved.

The reason why the initialization leads to high speed in the present embodiment is as follows. That is, if the first switch $SW_1$ switches to the close state and the second switch $SW_2$ also switches to the close state at the time $t_2$, then the electric charge accumulated in the capacitive element C until the time $t_2$ flows also through the second switch $SW_2$ and therefore the capacitive element C is quickly discharged. Generally, an attempt to achieve low power consumption makes it difficult to achieve high speed, but in the present embodiment, the provision of the second switch $SW_2$ makes it possible to achieve both low power consumption and high speed.

Figure 3:
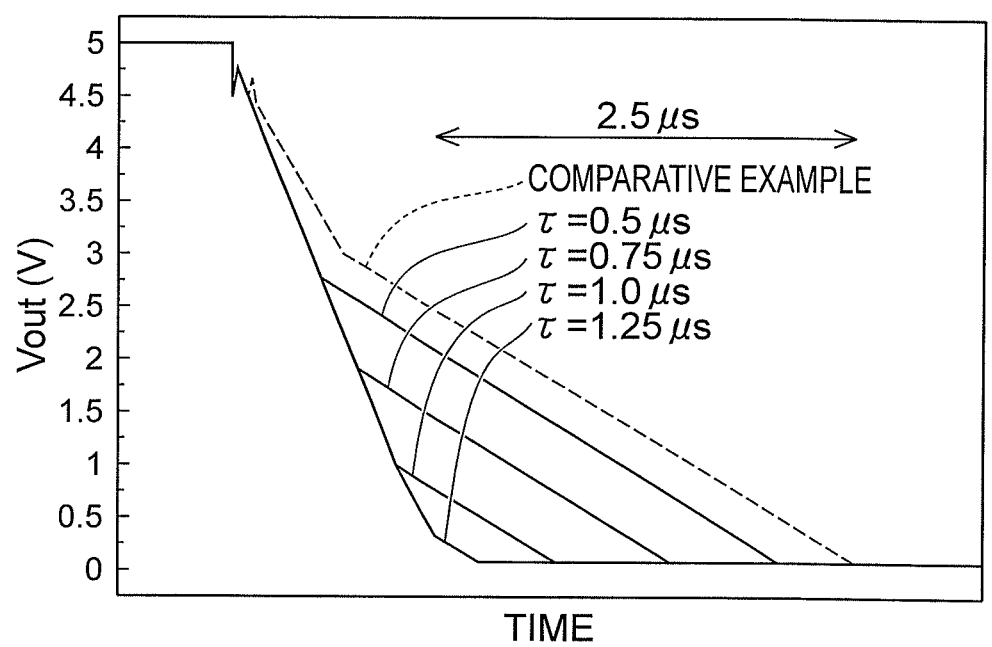
FIG. 3 is a view illustrating the operation of the photodetecting device 1 according to the embodiment.

FIG. 3 is a view illustrating the operation of the photodetecting device 1 according to the present embodiment. Here, there are shown the results of a simulation performed with a length τ of a period (period from the time $t_2$ to the time $t_3$ in FIG. 2), in which the second switch $SW_2$ is in the close state, as each value. It can be seen that in the present embodiment, by setting the time τ so that the output voltage value Vout reaches a value near the initial value during the time τ, the time required for initialization can be shortened by approximately 2.5 μs as compared with the case of the comparative example.

Industrial Applicability

The present invention can be used as an integrating circuit and a photodetecting device capable of achieving both low power consumption and high speed.

Reference Signs List

1—photodetecting device, 10—integrating circuit, 20—amplifier circuit, $SW_1$—first switch, $SW_2$—second switch, C—capacitive element, PD—photodiode, 50—controlling section.

The invention claimed is:

1. An integrating circuit comprising:
   an amplifier circuit having a first input terminal, a second input terminal, and an output terminal;
   a capacitive element provided between the first input terminal and the output terminal of the amplifier circuit;
   a first switch provided in parallel to the capacitive element between the first input terminal and the output terminal of the amplifier circuit; and
   a second switch provided between a reference potential input terminal to which a reference potential is input and a terminal of the capacitive element on the first input terminal side of the amplifier circuit, the second switch applying the reference potential to the terminal of the capacitive element, wherein
   when the first switch is closed to discharge the capacitive element, the second switch is also closed.

2. A photodetecting device comprising:
   the integrating circuit according to claim 1; and
   a photodiode which generates an amount of electric charge according to an amount of incident light and causes the generated electric charge to enter the first input terminal of the amplifier circuit in the integrating circuit.

* * * * *